United States Patent
Koo et al.

(10) Patent No.: US 9,142,801 B2
(45) Date of Patent: Sep. 22, 2015

(54) METHOD FOR MANUFACTURING FLEXIBLE ELECTRODE SUBSTRATE

(75) Inventors: Jae Bon Koo, Daejeon (KR); In-Kyu You, Daejeon (KR); Yong Suk Yang, Daejeon (KR); Minseok Kim, Cheongju-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 671 days.

(21) Appl. No.: 13/554,069

(22) Filed: Jul. 20, 2012

(65) Prior Publication Data
US 2013/0108777 A1    May 2, 2013

(30) Foreign Application Priority Data
Nov. 1, 2011   (KR) .................. 10-2011-0113006

(51) Int. Cl.
*H01L 51/52*   (2006.01)
*H01L 51/00*   (2006.01)

(52) U.S. Cl.
CPC ........ *H01L 51/5275* (2013.01); *H01L 51/0097* (2013.01); *H01L 51/5206* (2013.01); *Y02E 10/549* (2013.01)

(58) Field of Classification Search
CPC ................................................. H01L 51/0097
See application file for complete search history.

(56) References Cited

U.S. PATENT DOCUMENTS

| 7,586,245 B2 * | 9/2009 | Haenichen et al. ........... 313/116 |
| 2007/0081254 A1 * | 4/2007 | Endle et al. .................. 359/626 |

FOREIGN PATENT DOCUMENTS

| JP | 2002-318555 A | 10/2002 |
| KR | 10-2007-0065588 A | 6/2007 |

* cited by examiner

*Primary Examiner* — Nathan T Leong
(74) *Attorney, Agent, or Firm* — Rabin & Berdo, P.C.

(57) ABSTRACT

Provided is a method for manufacturing a flexible electrode substrate. The method includes forming a microlens array under a film, forming a transparent electrode layer on the film so as to oppose the microlens array, and forming a grid electrode between the film and the transparent electrode layer or on the transparent electrode layer. Herein, the grid electrode and the microlens array are formed on the both sides of the film by performing at least one of an inkjet printing process, a roll-to-roll printing process, a screen printing process, and a stamping printing process.

12 Claims, 10 Drawing Sheets

METHOD FOR MANUFACTURING FLEXIBLE ELECTRODE SUBSTRATE

CROSS-REFERENCE TO RELATED APPLICATIONS

This U.S. non-provisional patent application claims priority under 35 U.S.C. §119 of Korean Patent Application No. 10-2011-0113006, filed on Nov. 1, 2011, the entire contents of which are hereby incorporated by reference.

BACKGROUND OF THE INVENTION

The present invention disclosed herein relates to a flexible electrode substrate, and more particularly, to a flexible electrode substrate of a light-emitting diode.

Recently, it has received great attention to develop a technology for manufacturing a flexible and stretchable electronic device by mounting an electronic element on a plastic substrate. For instance, a flexible display, a flexible solar cell, a flexible RFID, and the like are manufactured by mounting electronic elements on a plastic substrate. Although there are various types of the flexible display, it is considered to be one of the most difficult and high potential techniques to manufacture a flexible organic light emitting diode (OLED). The OLED, which emits light by virtue of recombination of electrons and holes in organic matter disposed between an anode and a cathode, is usually applied to a display device. In order to commercialize OLED lighting, it is needed to solve a voltage drop problem and improve light extraction efficiency.

The voltage drop of the OLED may occur due to high resistance of a transparent electrode layer. The voltage drop of the transparent electrode layer may be prevented by forming auxiliary wiring on a transparent electrode. However, a typical auxiliary wiring is formed by performing a photolithography process, which may increase the cost of producing the OLED.

The light extraction efficiency may be improved by means of a microlens or surface curve formed on the rear of a substrate. However, the costly photolithography process is required to form a typical microlens or surface curve. Thus, productivity is decreased.

SUMMARY OF THE INVENTION

The present invention provides a method for manufacturing a flexible electrode substrate, which includes a printing process that costs less than a photolithography process.

The present invention also provides a method for manufacturing a flexible electrode substrate, which is capable of increasing or maximizing productivity.

Embodiments of the inventive concept provide methods for manufacturing a flexible electrode substrate, the method including: forming a microlens array under a film; forming a transparent electrode layer on the film so as to oppose the microlens array; and forming a grid electrode between the film and the transparent electrode layer or on the transparent electrode layer. Herein, the grid electrode and the microlens array are formed on the both sides of the film by performing at least one of an inkjet printing process, a roll-to-roll printing process, a screen printing process, and a stamping printing process.

In some embodiments, the forming of the grid electrode may include forming a transparent mold layer having trenches on the film, and filling the grid electrode within the trenches of the transparent mold layer.

In other embodiments, the transparent mold layer may include a transparent polymer printed by performing the stamping printing process, the roll-to-roll printing process, or the screen printing process.

In still other embodiments, the transparent polymer may include at least one of polymethyl methacrylate, polyimide, polystyrene, polyvinylphenol, acryl polymer, and epoxy-based polymer.

In even other embodiments, the grid electrode may be formed of ink filled within the trenches.

In yet other embodiments, the ink may include conductive metal or graphene.

In further embodiments, the transparent electrode layer may include indium tin oxide or zinc oxide formed by performing a wet process or the roll-to-roll printing process.

In still further embodiments, the method may further include printing a bank layer covering the grid electrode on the transparent electrode layer.

In even further embodiments, the microlens array may be embossed.

In yet further embodiments, the microlens array may be printed by performing the inkjet printing process.

In much further embodiments, the microlens array may be engraved.

In still much further embodiments, the microlens array may be printed by performing the stamping printing process or the roll-to-roll printing process. Herein, the roll-to-roll printing process may include gravure, gravure offset, or reverse offset.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF PREFERRED EMBODIMENTS

Preferred embodiments of the inventive concept will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In this description, when an element is referred to as being 'on' another element, it can be directly on the other element, or intervening elements may also be present. In the drawings, the dimensions of elements are exaggerated for clarity of illustration. Like reference numerals refer to like elements throughout.

The embodiments of the inventive concept will be described with reference to exemplary cross-sectional view and/or planar views. In the drawings, the dimensions of layers and regions are exaggerated for clarity of illustration. Therefore, the forms of the exemplary drawings may be changed due to manufacturing technology and/or error tolerance. Therefore, the regions on the drawings are just schematic. The shapes of the regions exemplify specific shapes of the elements and do not delimit the scope of the invention. The embodiments described herein include complementary embodiments thereof.

The terminology used herein is not for delimiting the present invention but for describing the embodiments. The terms of a singular form may include plural forms unless otherwise specified. The meaning of "comprise" or "comprising" does not exclude one or more other elements.

Figure 1:
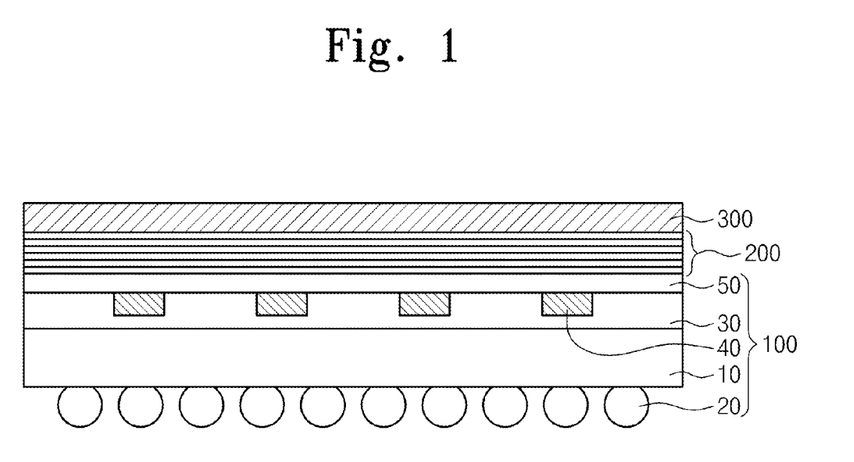
FIG. 1 is a cross-sectional view illustrating an organic light emitting diode according to the inventive concept.

FIG. 1 is a cross-sectional view illustrating an organic light emitting diode according to the inventive concept.

Referring to FIG. 1, the organic light emitting diode may include an upper electrode 300, a transparent electrode layer 50 disposed under an organic electroluminescent layer 200, and a flexible electrode substrate 100 having a substrate film 10 that supports the transparent electrode layer 50. A transparent mold layer 30 and a grid electrode 40 may be disposed between the transparent electrode layer 50 and the substrate film 10. The grid electrode 40 may reduce a voltage drop in the large-area transparent electrode layer 50.

The flexible electrode substrate 100 having the grid electrode 40 may be adopted for a solar cell, a display device, or a touch panel. Although not illustrated, the grid electrode 40 may be disposed on the transparent electrode layer 50. A microlens array 20 may be disposed under the substrate film 10. The microlens array 20 may be embossed or intagliated with respect to a lower surface of the substrate film 10. The flexible electrode substrate 100 is manufactured by using a printing process which is cheaper than a typical photolithographic process. Therefore, the manufacturing cost of the organic light emitting diode may be minimized.

A method for manufacturing the flexible electrode substrate 100 of the present invention will be described with reference to embodiments.

FIGS. 2 to 5 are cross-sectional views illustrating a method for manufacturing a flexible electrode substrate according to a first embodiment of the inventive concept.

Figure 2:
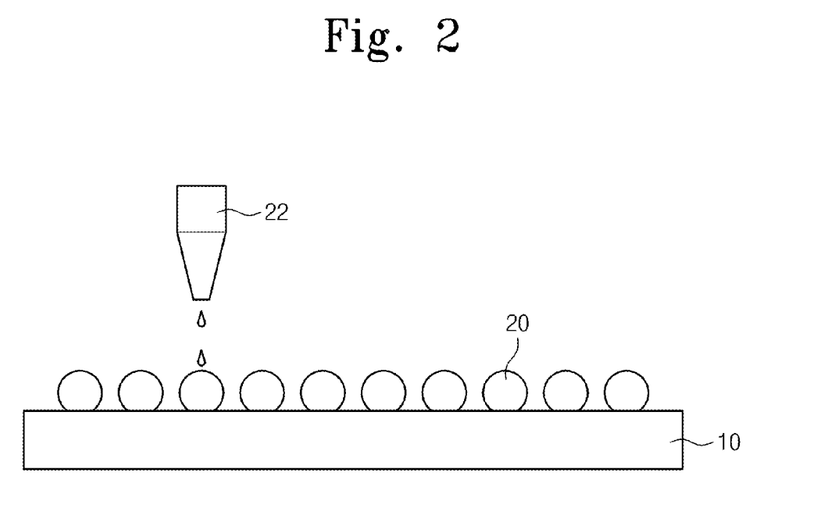
FIGS. 2 to 5 are cross-sectional views illustrating a method for manufacturing a flexible electrode substrate according to a first embodiment of the inventive concept.

Referring to FIG. 2, the microlens array 20 is formed on a lower surface of the substrate film 10. The substrate film 10 may include plastic or polymer having excellent transparency. The microlens array 20 may be printed to be embossed on the lower surface of the substrate film 10 by using an inkjet technique. The microlens array 20 may include a polymer or plastic having a refractive index which is the same as or higher than that of the substrate film 10. The polymer or plastic may be printed on corresponding locations on the substrate film 100 through a nozzle 22. The polymer or plastic may be regularly embossed, due to self aggregation thereof, on a surface of the substrate film 10.

Figure 3:
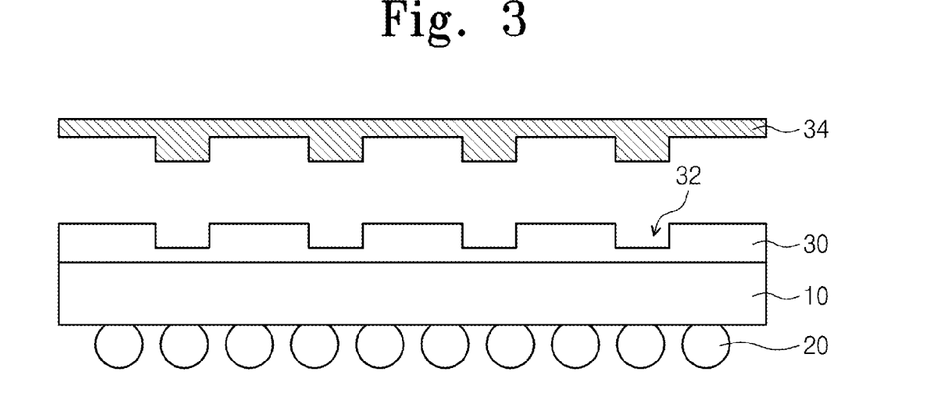

Referring to FIG. 3, the transparent mold layer 30 having a trench 32 is formed on the substrate film 10. The transparent mold layer 30 may include a transparent polymer such as polymethyl methacrylate (PMMA), polyimide, polystyrene, polyvinylphenol, acryl polymer, or epoxy-based polymer. The transparent mold layer 30 may be printed on the substrate 10 by using a roll-to-roll technique or stamping technique. The trench 32 may be engraved when a transparent organic material is printed. For example, the trench 32, which is printed by using the roll-to-roll technique, may be formed at the same time when the transparent organic material coats the substrate film 10. On the contrary, the trench 32, which is printed by using the stamping technique, may be formed by a stamp 34 which is pressed against the transparent organic material that is previously applied onto the substrate film 10. The trench 32 may have a form of a mesh with respect to a whole surface of the substrate film 10.

Figure 4:
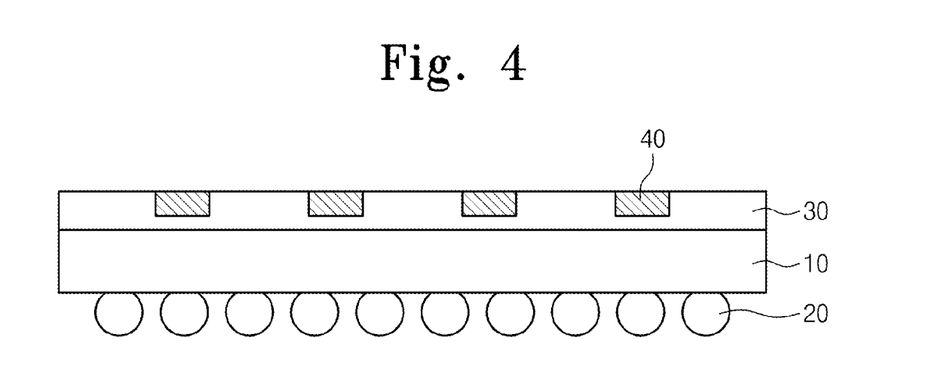

Referring to FIG. 4, the grid electrode 40 is formed within the trench 32 of the transparent mold layer 30. The grid electrode 40 may be filled within the trench of the transparent mold layer 30 by using a printing technique such as the roll-to-roll technique, inkjet technique, or screen technique. The grid electrode 40 may include ink having conductive metal such as silver (Ag), copper (Cu), and gold (Au) or graphene. The printing process for the microlens array 20, transparent mold layer 30, and grid electrode 40 may reduce the manufacturing cost of the organic light emitting diode in comparison with the typical photolithography process. Therefore, according to the manufacturing method of the flexible electrode substrate according to the first embodiment of the inventive concept, the productivity may be increased or maximized.

Figure 5:
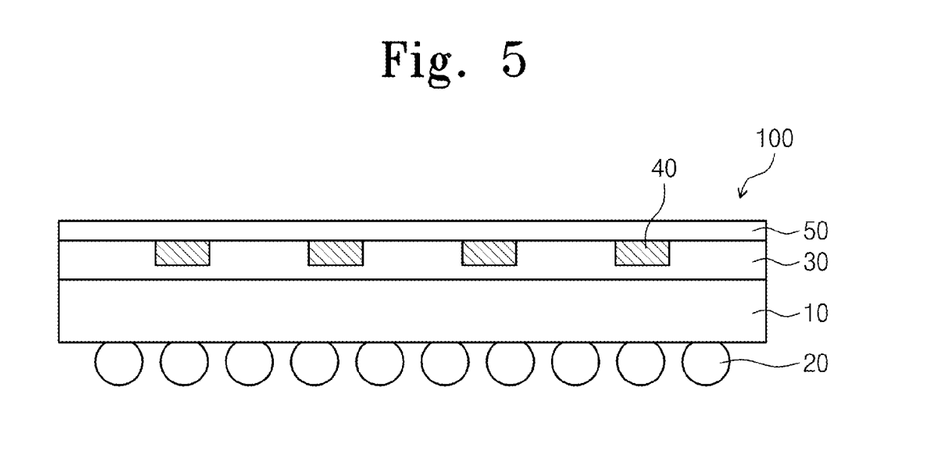

Referring to FIG. 5, the transparent electrode layer 50 is formed on the grid electrode 40 and transparent mold layer 30. The transparent electrode layer 50 may include indium tin oxide (ITO) and zinc oxide (ZnO) having a uniform thickness on the substrate film 10. The transparent electrode layer 50 may have excellent adhesive strength with respect to the transparent mold layer 30 and grid electrode 40. The transparent electrode layer 50 may be formed by performing a wet process or the roll-to-roll printing process. A typical transparent electrode layer may be formed by performing a sputtering process. The wet process of roll-to-roll printing process for the transparent electrode layer 50 may reduce the manufacturing cost in comparison with the sputtering process. The sputtering process is limited in that it should be performed in an independent space such as a chamber (not illustrated) having vacuum pressure. Therefore, the sputtering process may degrade the productivity of the large-area organic light emitting diode. Since the wet process or printing process is performed at an atmospheric pressure, spatial limitation may be minimized.

Therefore, according to the manufacturing method of the flexible electrode substrate according to the first embodiment of the inventive concept, the productivity may be increased or maximized.

FIGS. 6 to 9 are cross-sectional views illustrating a method for manufacturing a flexible electrode substrate according to a second embodiment of the inventive concept. FIG. 10 is a cross-sectional view illustrating an organic light emitting diode formed by using the manufacturing method of the flexible electrode substrate according to the second embodiment of the inventive concept.

Figure 6:
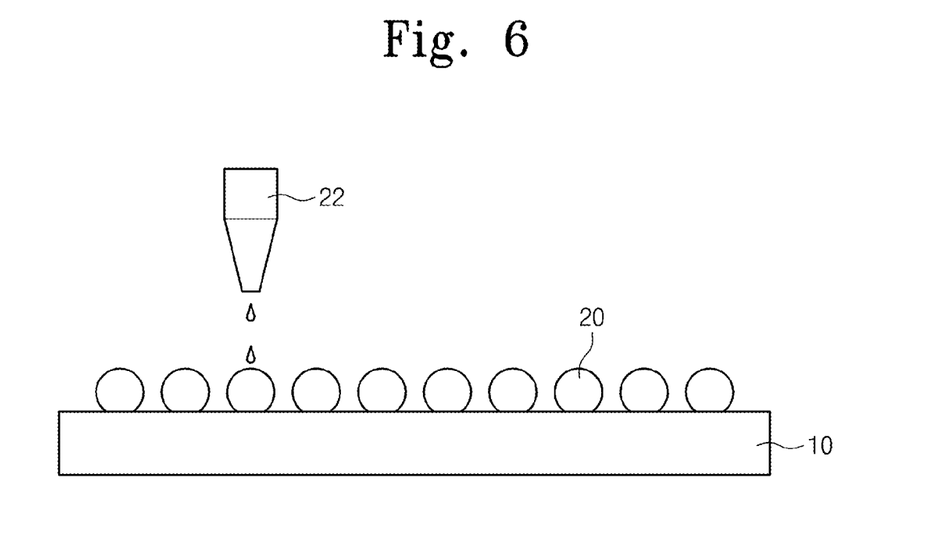
FIGS. 6 to 9 are cross-sectional views illustrating a method for manufacturing a flexible electrode substrate according to a second embodiment of the inventive concept.

Referring to FIG. 6, the microlens array 20 is formed on the lower surface of the substrate film 10. The substrate film 10 may include plastic or polymer having excellent transparency. The microlens array 20 may be printed to be embossed on the lower surface of the substrate film 10 by using the inkjet technique. The microlens array 20 may include a polymer or plastic having a refractive index which is the same as or higher than that of the substrate film 10.

Figure 7:
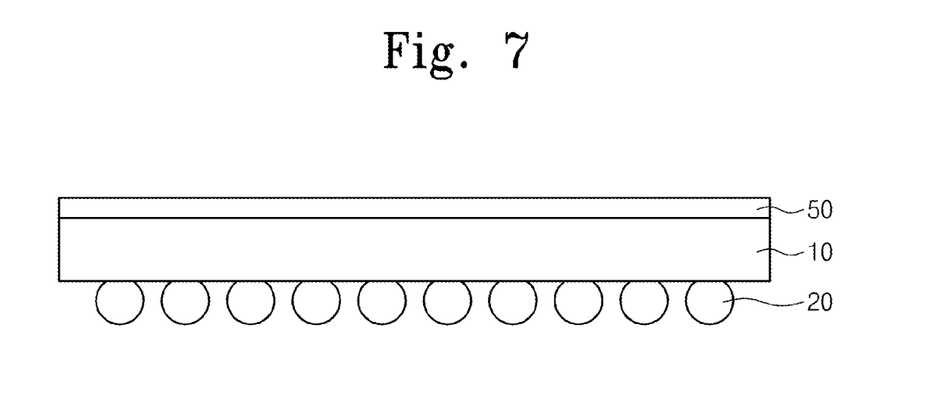

Referring to FIG. 7, the transparent electrode layer 50 is formed on the substrate film 10. The transparent electrode layer 50 may include indium tin oxide or zinc oxide. The transparent electrode layer 50 may be formed by performing the wet process or printing process described above with respect to the first embodiment. The transparent electrode layer 50 may be formed by performing the sputtering process when the substrate film is a rigid plate without elasticity.

Figure 8:
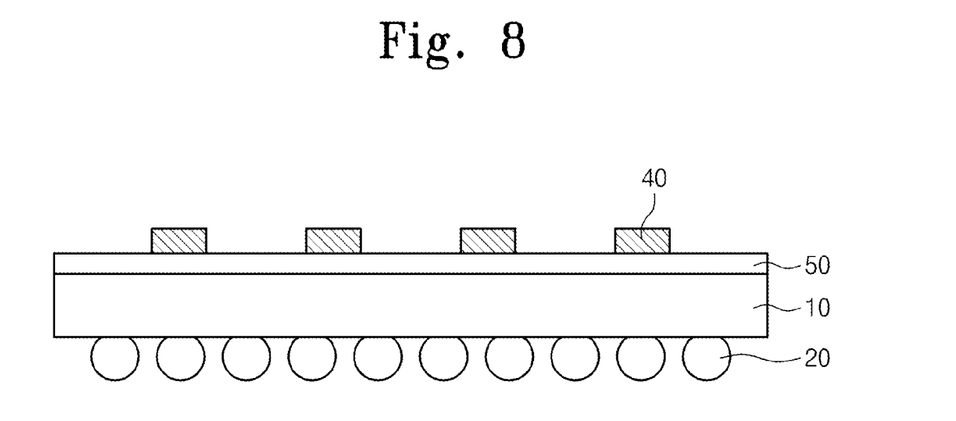

Referring to FIG. 8, the grid electrode 40 is formed on the transparent electrode layer 50. The grid electrode 40 may include ink having metal such as silver (Ag), copper (Cu), and gold (Au) or graphene. The grid electrode 40 may be printed on the transparent electrode layer 50 by using the roll-to-roll technique, inkjet technique, or screen technique. The roll-to-roll printing process may include gravure, gravure offset, or reverse offset.

Figure 9:
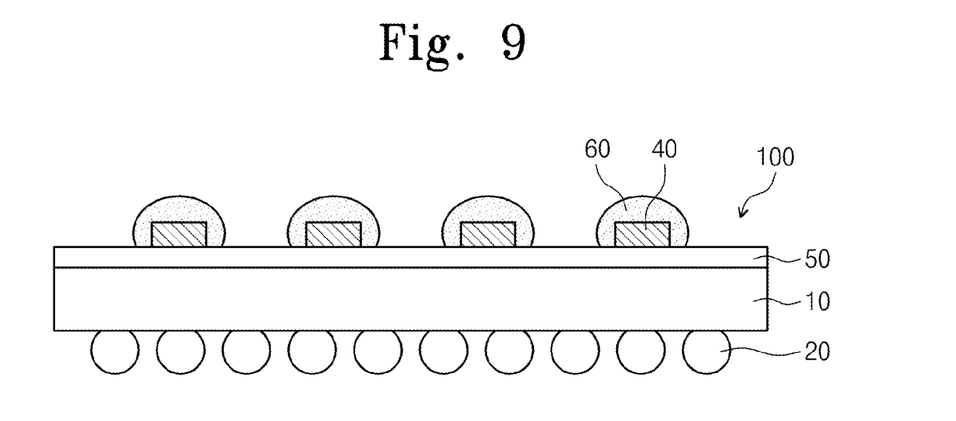
Figure 10:
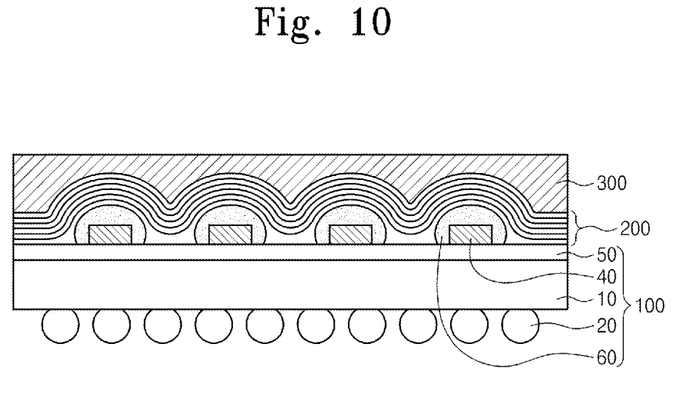
FIG. 10 is a cross-sectional view illustrating an organic light emitting diode formed by using the manufacturing method of the flexible electrode substrate according to the second embodiment of the inventive concept.

Referring to FIGS. 9 and 10, the grid electrode 40 is covered with the bank layer 60. The bank layer 60 may include a transparent polymer formed by performing the inkjet printing process or screen printing process. The bank layer 60 may include at least one of polymethyl methacrylate (PMMA), polyimide, polystyrene, polyvinylphenol, acryl polymer, and epoxy-based polymer. The bank layer 60 may insulate the grid electrode 40 from the organic electroluminescent layer 200. The bank layer 60 may adjust a contact area between the transparent electrode layer 50 and the organic electroluminescent layer 200. The bank layer 60 may release stress on the organic electroluminescent layer 200 from the transparent electrode layer 50 and grid electrode 40. That is, since a boundary between the organic electroluminescent layer 200 and the transparent electrode layer 50 is extended on the same plane as the bottoms of the grid electrode 40 and bank layer 60, the stress may be released. Life shortening of the organic electroluminescent layer 200 due to the stress existing on the transparent electrode layer 50 may be prevented.

Therefore, according to the manufacturing method of the flexible electrode substrate according to the second embodiment of the inventive concept, the productivity may be increased or maximized.

FIGS. 11 to 14 are cross-sectional views illustrating a method for manufacturing a flexible electrode substrate according to a third embodiment of the inventive concept. FIG. 15 is a cross-sectional view illustrating an organic light emitting diode formed by using the manufacturing method of the flexible electrode substrate according to the third embodiment of the inventive concept.

Figure 11:
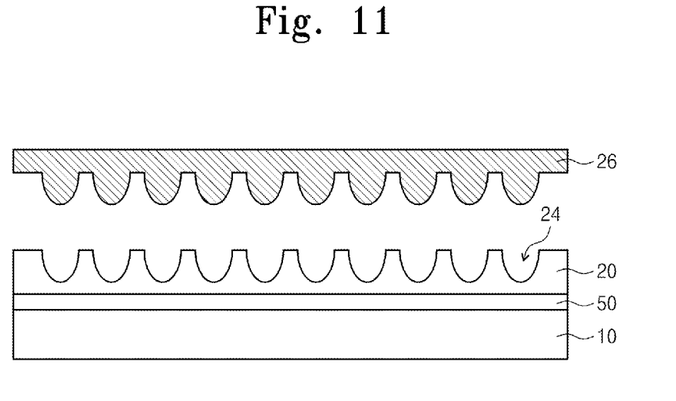
FIGS. 11 to 14 are cross-sectional views illustrating a method for manufacturing a flexible electrode substrate according to a third embodiment of the inventive concept.

Referring to FIG. 11, the microlens array 20 is formed to be engraved on the lower surface of the substrate film 10. The substrate film 10 may include plastic or polymer having high transparency. The microlens array 20 may be printed on the lower surface of the substrate film 10 by using the stamping technique or roll-to-roll technique. The microlens array 20 may include a polymer or plastic having a refractive index which is the same as or higher than that of the substrate film 10. The microlens array 20 may include concave parts 24 printed and engraved by a second stamp 26. Therefore, according to the manufacturing method of the flexible electrode substrate according to the third embodiment of the inventive concept, the productivity may be increased or maximized.

Figure 12:
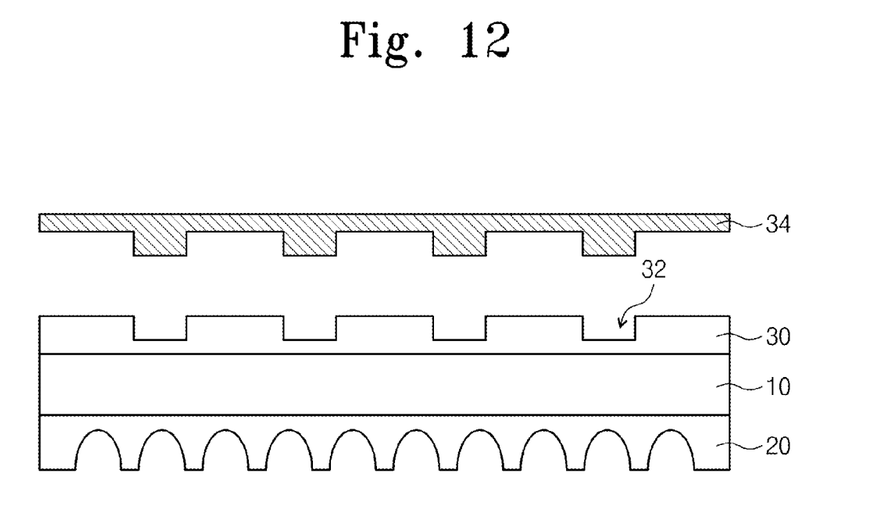

Referring to FIG. 12, the transparent mold layer 30 having the trench 32 is formed on an upper surface of the substrate film 10. The transparent mold layer 30 may include a transparent polymer such as polymethyl methacrylate (PMMA), polyimide, polystyrene, polyvinylphenol, acryl polymer, or epoxy-based polymer. The transparent mold layer 30 may be printed on the substrate 10 by using the roll-to-roll technique or stamping technique. The trench 32 may be engraved when a transparent organic material is printed. For example, the trench 32, which is printed by using the roll-to-roll technique, may be formed at the same time when the transparent material coats the substrate film 10. On the contrary, the trench 32, which is printed by using the stamping technique, may be formed by the stamp 34 which is pressed against the transparent organic material that is previously applied onto the substrate film 10. The trench 32 may have a form of a mesh with respect to a whole surface of the substrate film 10.

Figure 13:
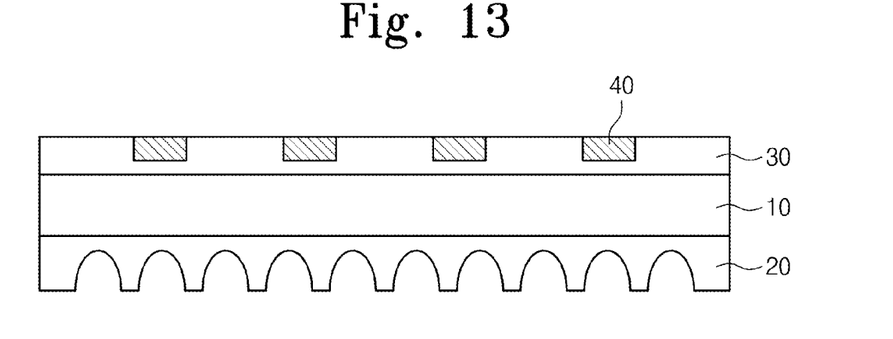

Referring to FIG. 13, the grid electrode 40 is formed within the trench 32 of the transparent mold layer 30. The grid electrode 40 may be filled within the trench of the transparent mold layer 30 by performing the inkjet printing process or screen printing process. The grid electrode 40 may include ink having conductive metal such as silver (Ag), copper (Cu), and gold (Au) or graphene. The printing process for the microlens array 20, transparent mold layer 30, and grid electrode 40 may reduce the manufacturing cost of the organic light emitting diode in comparison with the typical photolithography process. Therefore, according to the manufacturing method of the flexible electrode substrate according to the third embodiment of the inventive concept, the productivity may be increased or maximized.

Figure 14:
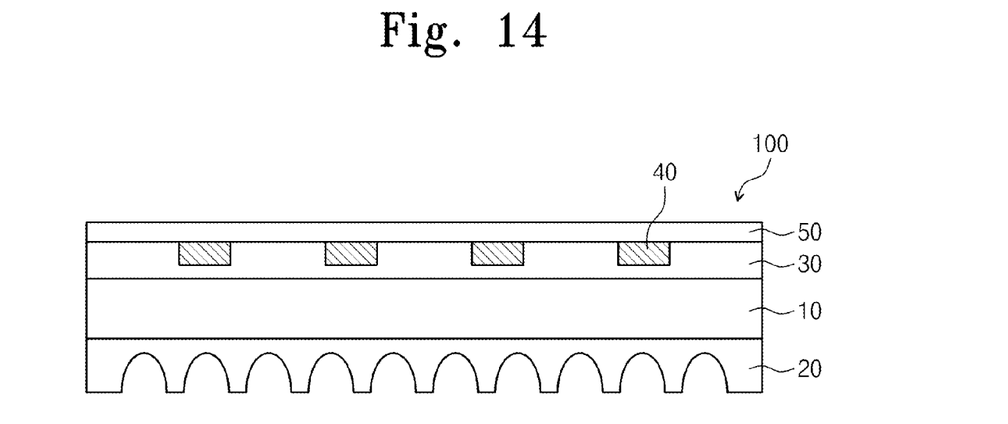
Figure 15:
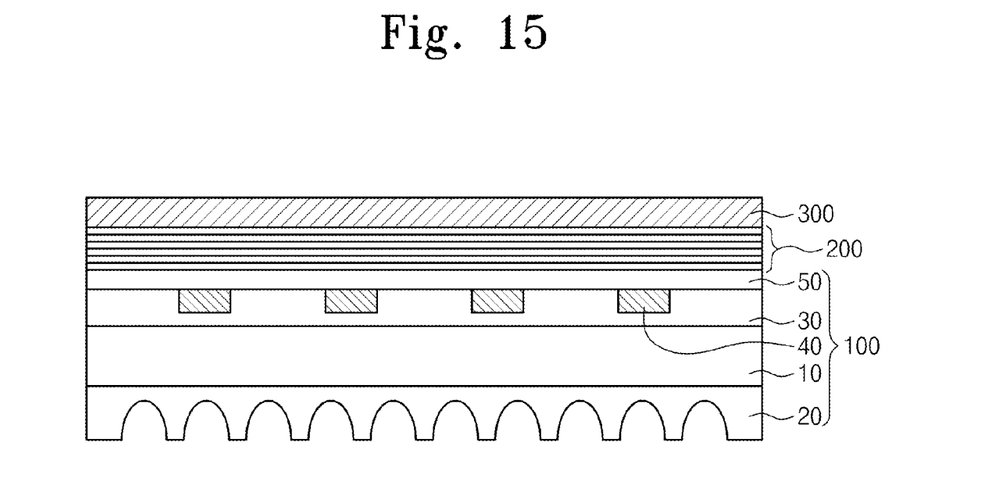
FIG. 15 is a cross-sectional view illustrating an organic light emitting diode formed by using the manufacturing method of the flexible electrode substrate according to the third embodiment of the inventive concept.

Referring to FIGS. 14 and 15, the transparent electrode layer 50 is formed on the grid electrode 40 and transparent mold layer 30. The transparent electrode layer 50 may include indium tin oxide (ITO) and zinc oxide (ZnO) having a uniform thickness on the substrate film 10. The transparent electrode layer 50 may have excellent adhesive strength with respect to the transparent mold layer 30 and grid electrode 40. The transparent electrode layer 50 may be formed by performing the wet process or the roll-to-roll printing process. A typical transparent electrode layer may be formed by performing a sputtering process. The wet process of roll-to-roll printing process for the transparent electrode layer 50 may reduce the manufacturing cost in comparison with the sputtering process. The sputtering process is limited in that it should be performed in an independent space such as a chamber (not illustrated) having vacuum pressure. Therefore, the sputtering process may degrade the productivity of the large-area organic light emitting diode. Since the wet process or printing process is performed at an atmospheric pressure, spatial limitation may be minimized.

Therefore, according to the manufacturing method of the flexible electrode substrate according to the third embodiment of the inventive concept, the productivity may be increased or maximized.

FIGS. 16 to 19 are cross-sectional views illustrating a method for manufacturing a flexible electrode substrate according to a fourth embodiment of the inventive concept. FIG. 20 is a cross-sectional view illustrating an organic light emitting diode formed by using the manufacturing method of the flexible electrode substrate according to the fourth embodiment of the inventive concept.

Figure 16:
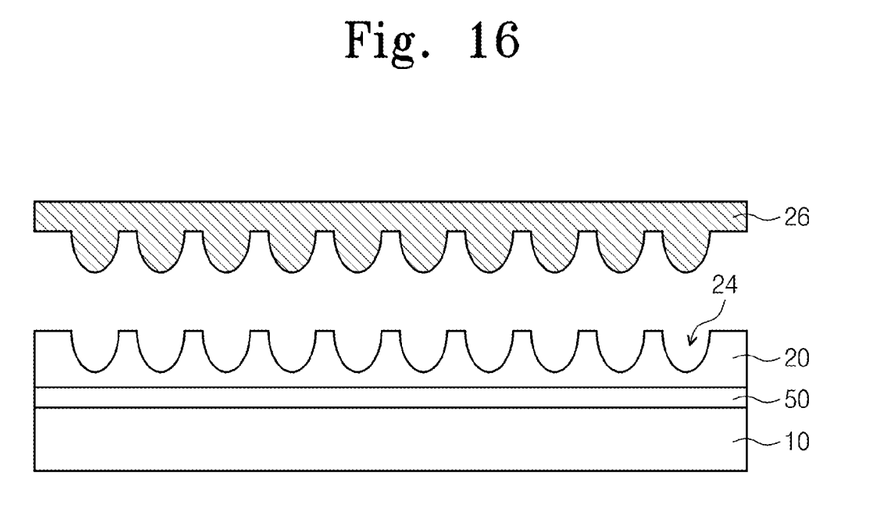
FIGS. 16 to 19 are cross-sectional views illustrating a method for manufacturing a flexible electrode substrate according to a fourth embodiment of the inventive concept.

Referring to FIG. 16, the microlens array 20 is formed to be engraved on the lower surface of the substrate film 10. The substrate film 10 may include plastic or polymer having high transparency. The microlens array 20 may be printed on the lower surface of the substrate film 10 by using the stamping technique or roll-to-roll technique. The microlens array 20 may include a polymer or plastic having a refractive index which is the same as or higher than that of the substrate film 10. The microlens array 20 may include concave parts 24 printed and engraved by the second stamp 26. The microlens array 20 may be formed by performing the printing process which is cheaper than the typical photolithography process. Therefore, according to the manufacturing method of the flexible electrode substrate according to the fourth embodiment of the inventive concept, the productivity may be increased or maximized.

Figure 17:
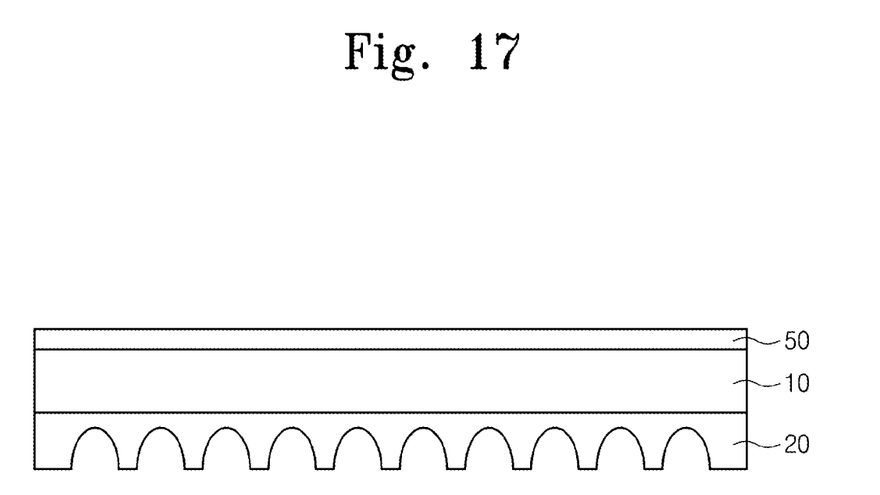

Referring to FIG. 17, the transparent electrode layer 50 is formed on the substrate film 10. The transparent electrode layer 50 may include indium tin oxide or zinc oxide. The transparent electrode layer 50 may be formed by using the wet process or printing process described above with respect to the first embodiment.

Figure 18:
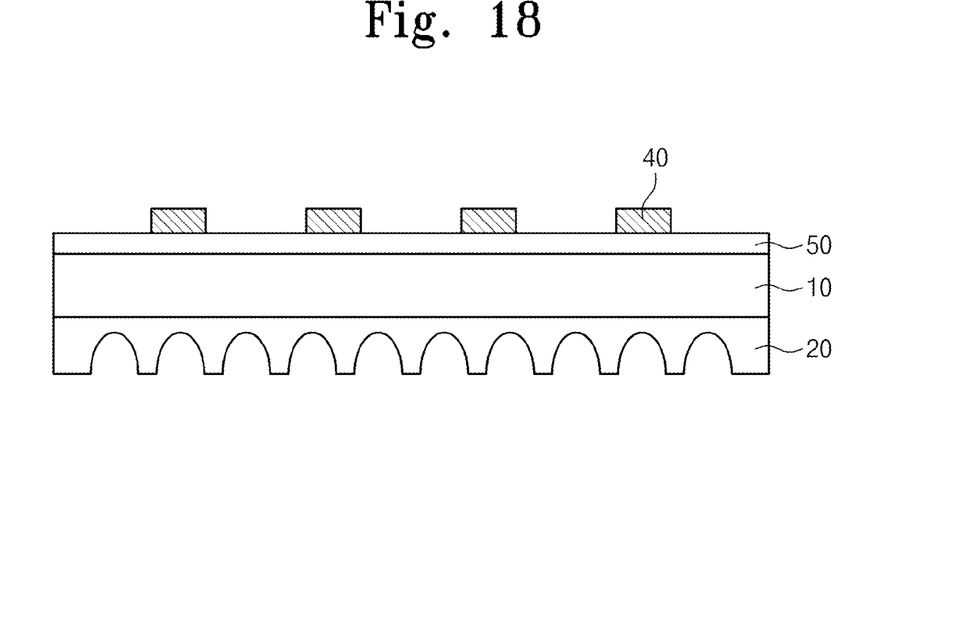

Referring to FIG. 18, the grid electrode 40 is formed on the transparent electrode layer 50. The grid electrode 40 may include ink having conductive metal such as silver (Ag), copper (Cu), and gold (Au) or graphene. The grid electrode 40 may be printed on the transparent electrode layer 50 by using the roll-to-roll technique, inkjet technique, or screen technique. The roll-to-roll printing process may include the gravure, gravure offset, or reverse offset.

Figure 19:
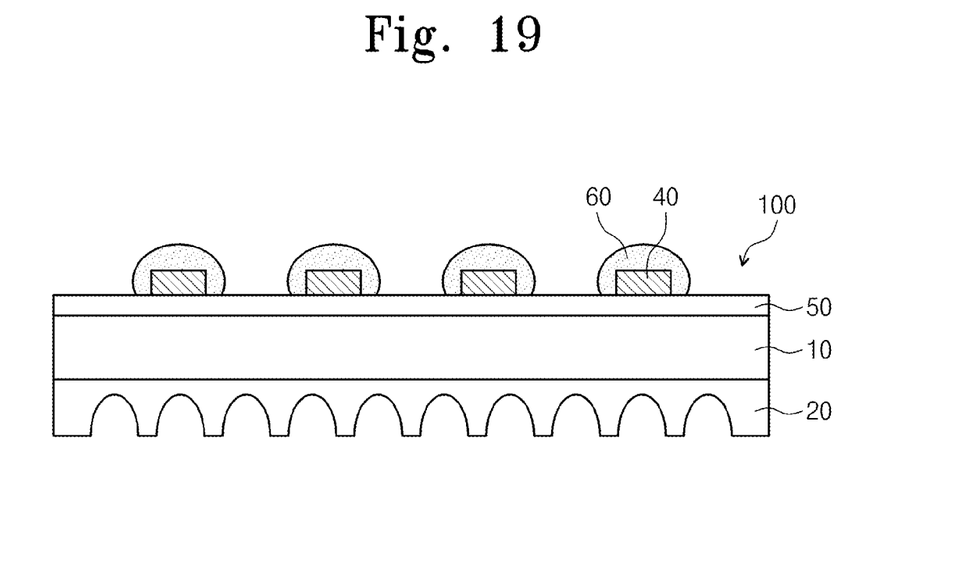
Figure 20:
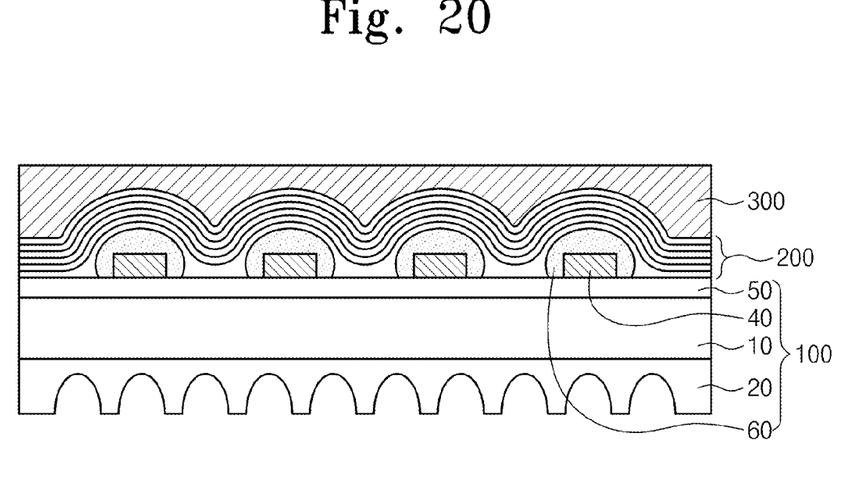
FIG. 20 is a cross-sectional view illustrating an organic light emitting diode formed by using the manufacturing method of the flexible electrode substrate according to the fourth embodiment of the inventive concept.

Referring to FIGS. 19 and 20, the grid electrode 40 is covered with the bank layer 60. The bank layer 60 may include a polymer formed by performing the inkjet printing process or screen printing process. The bank layer 60 may insulate the grid electrode 40 from the organic electroluminescent layer 200. The bank layer 60 may adjust a contact area between the transparent electrode layer 50 and the organic electroluminescent layer 200. The bank layer 60 may release stress on the organic electroluminescent layer 200 from the transparent electrode layer 50 and grid electrode 40. That is, since a boundary between the organic electroluminescent layer 200 and the transparent electrode layer 50 is extended on the same plane as the bottoms of the grid electrode 40 and bank layer 60, the stress may be released. Life shortening of the organic electroluminescent layer 200 due to the stress existing on the transparent electrode layer 50 may be prevented. Therefore, according to the manufacturing method of the flexible electrode substrate according to the fourth embodiment of the inventive concept, the productivity may be increased or maximized.

According to the embodiments of the inventive concept, the grid electrode and microlens array on and under the substrate film can be formed by performing the printing process which is cheaper than the photolithography process. The transparent electrode can be formed on or under the grid electrode by performing the wet process or printing process. Therefore, according to the manufacturing method of the flexible electrode substrate according to the embodiments of the inventive concept, the productivity can be increased or maximized.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for manufacturing a flexible electrode substrate, the method comprising:
   forming a microlens array under a film;
   forming a transparent electrode layer on the film so as to oppose the microlens array; and
   forming a grid electrode between the film and the transparent electrode layer or on the transparent electrode layer,
   wherein the grid electrode and the microlens array are formed on the both sides of the film by performing at least one of an inkjet printing process, a roll-to-roll printing process, a screen printing process, and a stamping printing process, wherein the forming of the grid electrode comprises forming a transparent mold layer having trenches on the film and filling the grid electrode within the trenches of the transparent mold layer.

2. The method of claim 1, wherein the transparent mold layer comprises a transparent polymer printed by performing the stamping printing process, the roll-to-roll printing process, or the screen printing process.

3. The method of claim 2, wherein the transparent polymer comprises at least one of polymethyl methacrylate, polyimide, polystyrene, polyvinylphenol, acryl polymer, and epoxy-based polymer.

4. The method of claim 3, wherein the grid electrode is formed of ink filled within the trenches.

5. The method of claim 4, wherein the ink comprises conductive metal or graphene.

6. The method of claim 1, wherein the transparent electrode layer comprises indium tin oxide or zinc oxide formed by performing a wet process or the roll-to-roll printing process.

7. The method of claim 1, further comprising printing a bank layer covering the grid electrode on the transparent electrode layer.

8. The method of claim 1, wherein the microlens array is embossed.

9. The method of claim 8, wherein the microlens array is printed by performing the inkjet printing process.

10. The method of claim 1, wherein the microlens array is engraved.

11. The method of claim 10, wherein the microlens array is printed by performing the stamping printing process or the roll-to-roll printing process.

12. The method of claim 11, wherein the roll-to-roll printing process comprises gravure, gravure offset, or reverse offset.

* * * * *